United States Patent [19]
Bernier

[11] Patent Number: 5,684,322
[45] Date of Patent: Nov. 4, 1997

[54] SENSITIVE PROTECTION COMPONENT FOR A SUBSCRIBER LINE INTERFACE CIRCUIT

[75] Inventor: Eric Bernier, Mettray, France

[73] Assignee: SGS-Thomson Microelectronics S.A., Saint Genis, France

[21] Appl. No.: 641,410

[22] Filed: May 1, 1996

[30] Foreign Application Priority Data

May 12, 1995 [FR] France ............... 95 05878

[51] Int. Cl.⁶ .................................. H01L 23/62
[52] U.S. Cl. ............... 257/355; 256/356; 256/361; 256/362; 256/577; 361/91; 361/111; 361/119
[58] Field of Search .................. 257/362, 356, 257/355, 361, 577; 361/91, 111, 119

[56] References Cited

U.S. PATENT DOCUMENTS

| | | | |
|---|---|---|---|
| 4,821,315 | 4/1989 | Remmerie et al. | 379/412 |
| 4,847,724 | 7/1989 | Renous | 361/91 |
| 5,304,802 | 4/1994 | Kumagai | 257/328 |
| 5,304,823 | 4/1994 | Byatt | 257/146 |
| 5,543,650 | 8/1996 | Au et al. | 257/355 |

FOREIGN PATENT DOCUMENTS

| | | | |
|---|---|---|---|
| A-0 388 022 | 9/1990 | European Pat. Off. | H04M 3/18 |
| A-0 600 810 | 6/1994 | European Pat. Off. | H01L 27/02 |
| 2105468 | 4/1990 | Japan | 257/356 |
| 3120758 | 5/1991 | Japan | 257/356 |
| 4332170 | 11/1992 | Japan | 257/356 |

*Primary Examiner*—William Mintel
*Attorney, Agent, or Firm*—Wolf, Greenfield & Sacks, P.C.; James H. Morris

[57] ABSTRACT

A high-speed monolithic protection semiconductor component implements two NPN transistors and two diodes. The cathodes of the diodes and the collectors of the transistors are connected to a common terminal. The anode of a diode is connected to the emitter of a transistor. The component includes a low-doped N-type semiconductor substrate whose bottom surface has a highly doped layer coated with a first metallization, first and second highly doped P-type regions, a low-doped P-type well in which are formed N-type third and fourth regions and a P-type fifth region. A second metallization connects the first and third regions. A third metallization connects the second and fourth regions. A fourth metallization is integral with the fifth region.

24 Claims, 3 Drawing Sheets

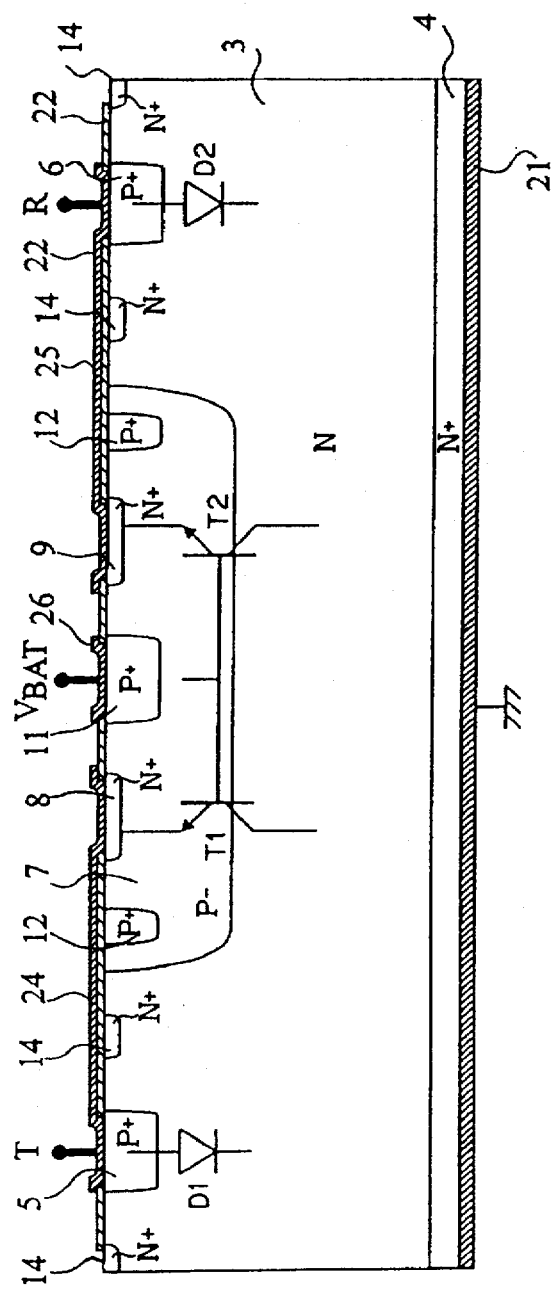

SENSITIVE PROTECTION COMPONENT FOR A SUBSCRIBER LINE INTERFACE CIRCUIT

BACKGROUND OF THE INVENTION

1. Field of the Invention

The present invention relates to protection devices for subscriber line interface circuits (SLIC). There is a need for specific protection for subscriber line interface circuits which are connected to telephone lines that may be impaired by various spurious phenomena. Some phenomena can be particularly damaging, for example, lightning or a short between the telephone line and the mains.

2. Discussion of the Related Art

As represented in FIG. 1, lines T and R of a telephone line, usually biased at negative voltages (for example −50 and −4 volts, respectively), are generally connected to the input of a SLIC through line pick-up relays 2. The SLIC includes various integrated circuits and is particularly sensitive to the occurrence of electrical overloads. Thus, in the prior art, several protection circuits for SLICs have been developed.

Generally, protection devices illustrated in blocks I, II and III of FIG. 1, are used separately or in combination.

The protection device I is disposed upstream from the line pick-up relays 2. Device I comes into play when the line pick-up relays are in ringing mode and must permit the flowing of relatively high ringing currents. For this purpose, this device generally comprises bidirectional protection components adjusted to values of approximately 250 volts. The protection components withstand overloads higher than 30 A for a 10/1000-μs standardized overload wave.

The protection device II is disposed between the line pick-up relays and the SLIC. The device II can be actuated only once the line is connected, i.e., when the relays are in the speaking mode. The protection level of device II is usually adjusted between 50 and 80 volts. Furthermore, this component must be adapted to withstand high overloads such as those caused by lightning or by the line contacting a power supply line.

In blocks I and II, conventional protection devices are represented. Many variants of these protection devices can be used. Also, it is known in the prior art to group the devices of blocks I and II. However, devices I and II, which should be capable of withstanding very high overloads, cannot presently reach, at moderate costs, the rapidity requirements for the present SLIC integrated circuits.

As a consequence, in addition to devices I and II, a fast third level of close protection is generally provided, i.e., the device III of FIG. 1. Device III is disposed close to the inputs of the SLIC. The rapidity requirement can be met because device III is not intended to withstand high overloads. Rather, it withstands only the fast rising initial portion of an overload. In fact, as soon as device III starts to operate, the resistor connected in series with the line upstream from device III causes the line voltage to increase and one of the devices I and II is triggered. Generally, it is assumed that device III has only to withstand a few tens of an ampere for periods shorter than 20 μs.

The device III of FIG. 1 includes two diodes having their anodes connected to the conductors of the line and their cathodes both connected to ground, and two diodes having their cathodes connected to the conductors of the line and their common anode connected to the battery voltage available from the SLIC. Each of these diodes is designed to operate in the forward direction. Thus, very fast diodes with low peak-on overvoltages are desired. If a positive overvoltage occurs at one line T or R (which are normally negatively biased), the overvoltage is absorbed by the diodes connected to ground. If a voltage lower than the battery voltage occurs at one of the lines, it is discharged down to the battery voltage $V_{BAT}$ (usually a negative voltage of approximately −48 volts).

In the prior art, a device equivalent to the protection device illustrated in block III of FIG. 1, and achieved in the form of a monolithic component on a single semiconductor substrate is not available. It can be seen that this circuit includes two diodes connected by their anodes and two additional diodes connected by their cathodes. This unavoidably creates a monolithic circuit having a combination of vertical diodes with lateral diodes, which slows the response time of the device.

SUMMARY OF THE INVENTION

An object of the present invention is to provide a protection component in the form of a monolithic circuit without impairing its rapidity and low peak-on characteristics.

The invention more particularly provides a fast monolithic protection semiconductor component which includes two NPN transistors and two diodes. The cathodes of the diodes and the collectors of the transistors are connected to a common terminal. The anode of a diode and the emitter of a transistor are connected to a first terminal. The anode of the other diode and the emitter of the other transistor are connected to a second terminal. The bases of the transistors are connected to a reference voltage. This component includes, on the bottom surface of a low-doped N-type semiconductor substrate, a highly doped layer coated with a first metallization, and on the side of the upper surface of the substrate, first and second highly-doped P-type regions and a low-doped P-type well in which are formed third and fourth N-type regions and a fifth P-type region. A second metallization connects the first and third regions. A third metallization connects the second and fourth regions. A fourth metallization is integral with the fifth region.

In another aspect of the invention, a monolithic semiconductor protection component includes two diodes and two transistors. The cathodes of the two diodes and the collectors of the two transistors are coupled to a common terminal. The emitter of one of the transistors and the anode of one of the diodes is coupled to a first terminal. The emitter of the other transistor and the anode of the other diode are coupled to a second terminal.

In another aspect of the invention, a method of protecting a circuit from over and undervoltages is disclosed. The method includes receiving a reference voltage from the circuit. A first low resistive connection is provided between an input of the circuit and ground when an overvoltage occurs at the input. A second low resistive connection is provided between the input of the circuit and ground when an undervoltage below the reference voltage occurs at the input.

According to an embodiment of the invention, the well is surrounded with an N-type ring.

According to an embodiment of the invention, the periphery of the component is surrounded with an N-type ring.

According to an embodiment of the invention, a P-type ring is formed at the inner periphery of the well. This P-type ring can be continuous with the fifth region.

According to an embodiment of the invention, the substrate includes a low-doped N-type layer epitaxially formed on a highly-doped N-type wafer.

According to an embodiment of the invention, the well has a surface concentration ranging from 1 to $5.10^{15}$ atoms/cm$^3$, the junction depth ranging from 30 to 40 μm.

The foregoing and other objects, features, aspects and advantages of the invention will become apparent from the following detailed description of illustrative embodiments of the present invention when taken in conjunction with the accompanying drawings.

BRIEF DESCRIPTION OF DRAWINGS

FIGS. 3 and 4 are cross-sectional views of embodiments of a monolithic semiconductor component according to the invention which achieves the close protection function of a SLIC.

DETAILED DESCRIPTION

Figure 1:
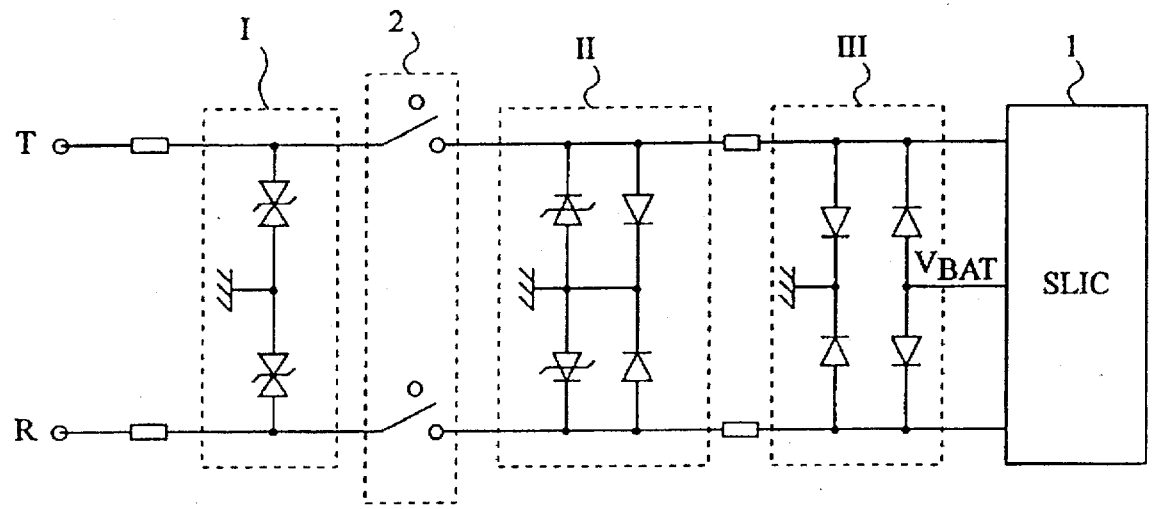
FIG. 1 represents a prior art protection scheme for a SLIC.
Figure 2:
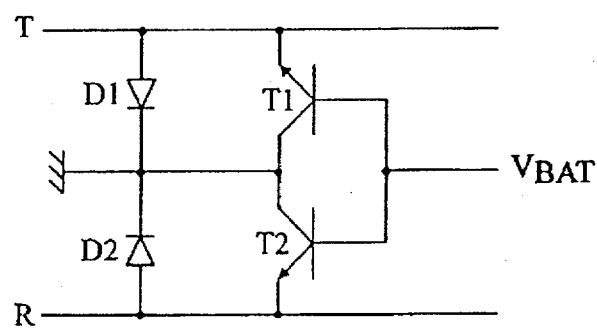
FIG. 2 represents a circuit of an embodiment of a specific close protection device for a SLIC according to the present invention.

As shown in the embodiment of FIG. 2, in order to provide close protection for a SLIC, the present invention uses a device which includes two diodes D1, D2 and two transistors T1, T2. The anodes of diodes D1, D2 are respectively connected to lines T and R and their cathodes are connected together to ground. The respective emitters of NPN-type transistors T1 and T2 are connected to lines T and R. The collectors of the transistors are both connected to ground. The transistor bases are both connected to voltage $V_{BAT}$.

The structure of the embodiment shown in FIG. 2 is particularly advantageous in that each of the transistors triggers when the voltage at its emitter becomes lower than the negative voltage $V_{BAT}$. When this occurs the overload current is drawn not from voltage $V_{BAT}$ but from ground. Thus, the current surge on the voltage source $V_{BAT}$ corresponds to the overload intensity divided by the gain of the transistors. This is advantageous because voltage $V_{BAT}$ available from the SLIC is a voltage occurring across a capacitor and present standards require current surges from $V_{BAT}$ to be minimized.

The embodiment of the present invention based on the selection of the circuit illustrated in FIG. 2 is preferably implemented in the form of a monolithic component while maintaining the following advantages:

fast, low peak-on diodes D1 and D2;

fast switching-on transistors T1 and T2;

high-gain (50-150) transistors T1 and T2, for limiting the current extracted from source $V_{BAT}$;

transistors T1 and T2 have a high emitter-base breakdown voltage (approximately 100 V), adapted to withstand the reverse nominal voltage; and transistors T1 and T2 have a low resistance at the conductive state, adapted to prevent the component from heating and possibly being destroyed by overvoltages.

FIG. 3 is a schematic cross-sectional view of FIG. 2 as a monolithic component according to the present invention. As is conventional in integrated circuit representation, it will be noted that the thicknesses and lateral sizes of the various semiconductor layers and regions are not drawn to scale.

The component is achieved on an N-type substrate 3 whose bottom surface includes a highly-doped (N$^+$) N-type layer 4. First and second relatively high-doped P-type regions 5 and 6 and a low-doped (P$^-$) P-type well 7 are formed in the upper surface of the substrate. In well 7, are formed N$^+$-regions 8 and 9, a P$^+$ region 11 and a peripheral P$^+$ region 12. N$^+$-type rings 14 are formed in the substrate at the external periphery of the well 7 and at the periphery of the component.

The lower surface of the substrate is coated with a metallization 21. The upper surface of the substrate is coated with a thin oxide layer 22 except at places which should contact metallizations. On the upper surface, a first metallization 24 contacts regions 5 and 8, a second metallization 25 contacts regions 6 and 9, and a third metallization 26 contacts region 11.

Metallizations 21, 24, 25 and 26 are designed to be connected to ground, to line T, to line R, and to the negative voltage $V_{BAT}$, respectively. Between metallizations 24 and 21 are disposed a diode D1, whose anode corresponds to well 5 and whose cathode corresponds to the substrate, and an NPN transistor T1, whose emitter corresponds to region 8, the base corresponds to well 7, and the collector corresponds to substrate 3. Similarly, diode D2 and transistor T2 are formed between metallization 25 and the bottom surface metallization 21. Metallization 26 corresponds to the common base of transistors T1 and T2.

In the monolithic component of FIG. 3, the substrate 3 is selected so that its resistivity is as low as possible in order to minimize the peak-on overvoltage of diodes D1 and D2 which are formed by junctions 5-3 and 6-3. This allows the realization through diffusion (or implantation/diffusion) of a low-doped P$^-$ well 7 and thereby a high gain for the NPN transistors T1 and T2.

The doping of well 7 is, for example, selected with a surface concentration $C_s$ ranging from 1 to $5 \times 10^{15}$ atoms/cm$^3$, and a junction depth ranging from approximately 30 to 40 μm. An emitter/base breakdown voltage ($B_{VBE}$) of approximately 80 to 150 volts is then obtained while maintaining a high gain (50 to 150).

The P$^+$ regions 5, 6, 11 and 12 are simultaneously formed and have, for example, a surface concentration $C_s$ ranging from 1 to $5 \times 10^{18}$ atoms/cm$^3$, and a junction depth being approximately 20 to 25 μm. The surface concentration is selected to be sufficiently high to provide a suitable ohmic contact with the metallizations. The object of the P$^+$-type peripheral ring 12 is to avoid leakage currents caused by the generation of a surface inversion channel, which are likely to occur due to the very low doping level of well 7. The risk of triggering spurious lateral transistors or thyristors is also minimized by ring 12.

The N$^+$ regions 8, 9 and 14 and the bottom layer 4 are simultaneously formed and have, for example, a surface concentration $C_s$ ranging from $5 \times 10^{20}$ to $3 \times 10^{21}$ atoms/cm$^3$, and a junction depth being approximately 7 to 15 μm. The junction depths can be adjusted to adjust the transistor gains. Rings 14 have a stop-channel function.

Substrate 14 has, for example, a resistivity ranging from 2 to 5 ohms/cm.

As is apparent to those skilled in the art, various modifications can be made to the above disclosed embodiments. For example, although FIG. 3 describes a structure obtained from an N-substrate whose bottom surface includes a diffused N$^+$-layer, one can also use an N$^+$-substrate on which an N-layer is epitaxially grown.

FIG. 4 is a cross-sectional view of a structure where the N$^+$-substrate is referenced 31 and an epitaxial layer is referenced 33. This structure is advantageous in that the thickness of layer 33 is minimized, thereby decreasing the peak-on voltage of the diodes and the resistance in the conductive state ($R_{on}$) of the transistors, as well as increasing the gain of the transistors. Indeed, in the case of a structure diffused in an N⁻-substrate, shown in FIG. 3, for a minimum thickness of the wafer (approximately 200 µm), the remaining layer 3 has a thickness of approximately 150 µm, whereas in the case of an epitaxial layer, the thickness of layer 33 can be selected at a minimum value to withstand the applied voltage, i.e., approximately 75 µm. Dividing by two the layer thickness causes a similar reduction of the peak-on voltage of the diodes and the resistances at the conductive state ($R_{on}$) of the transistors.

Figure 5:
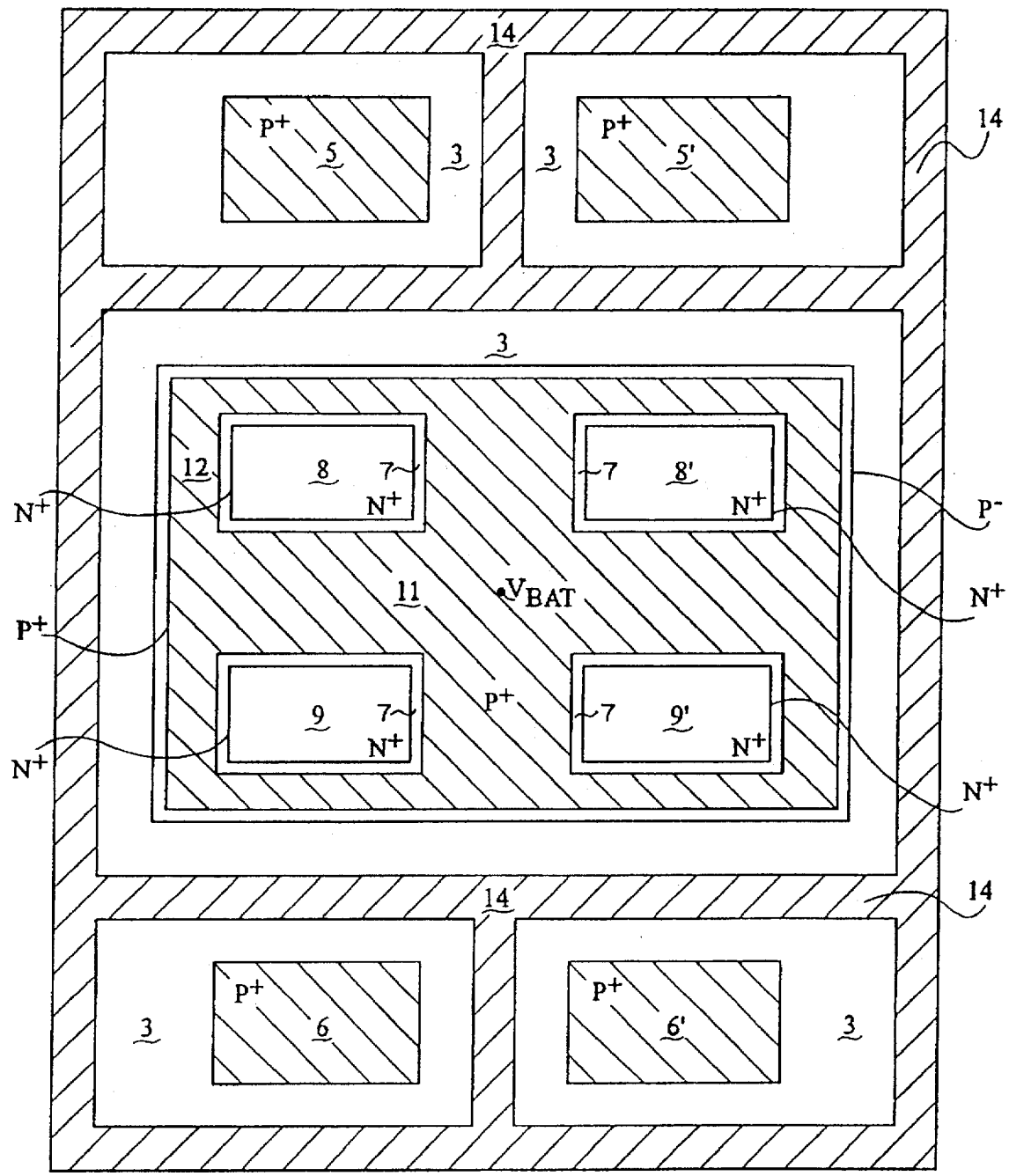
FIG. 5 is a top view of an exemplary double structure circuit including two components such as those of FIGS. 3 or 4.

FIG. 5 is a top view (without metallizations) of an exemplary component which combines two like structures such as those represented in the functional cross-sectional views of FIGS. 3 or 4. This component can be used to protect the two lines connected to a SLIC. A first protection set corresponds to the right portion of FIG. 5 and a second one to the left portion. The two sets have a common base region 7 connected to $V_{BAT}$. Rings 14 are continuous.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A high speed monolithic protection semiconductor component having formed thereon first and second NPN transistors each having a base, an emitter and a collector, first and second diodes each having a cathode and an anode, first, second, and common terminals, and wherein the cathodes of the first and second diodes and the collectors of the first and second transistors are adapted to be connected to the common terminal, the anode of the first diode and the emitter of the first transistor are adapted to be connected to the first terminal, the anode of the second diode and the emitter of the second transistor are adapted to be connected to the second terminal, and the bases of the first and second transistors are adapted to be connected to a reference voltage, the component comprising:

a low doped N-type semiconductor substrate having a first surface;

a highly-doped layer, bordering the first surface, coated with a first metallization;

first and second highly-doped P-type regions formed in the substrate;

a low doped P-type well formed in the substrate;

N-type third and fourth regions, and a P-type fifth region, the third, fourth and fifth regions formed in the low-doped P-type well;

a second metallization connecting the first and third regions;

a third metallization connecting the second and fourth regions, and a fourth metallization coupled to the fifth region.

2. The component of claim 1, further comprising an N-type ring, wherein the low-doped P-type well is surrounded by the N-type ring.

3. The component of claim 2, wherein a periphery of the component is surrounded by the N-type ring.

4. The component of claim 1, further comprising a P-type ring formed in the low-doped P-type well.

5. The component of claim 4, wherein the P-type ring is continuous with the fifth region.

6. The component of claim 1, wherein the substrate includes a low-doped N-type layer, the highly doped layer is a highly doped N-type wafer, and the low doped N-type layer is epitaxially formed on the highly-doped N-type wafer.

7. The component of claim 1, wherein the low-doped P-type well has a surface concentration ranging from $1 \times 10^{15}$ to $5 \times 10^{15}$ atoms/cm³, and a junction depth ranging from 30 to 40 µm.

8. A monolithic semiconductor protection component comprising:

a first diode having a cathode and an anode;

a second diode having a cathode and an anode;

a first transistor having a base, an emitter and a collector;

a second transistor having a base, an emitter and a collector;

a common terminal, wherein the cathodes of the first and second diodes and the collectors of the first and second transistors are coupled to the common terminal;

a first terminal, wherein the emitter of the first transistor and the anode of the first diode are coupled to the first terminal; and a second terminal, wherein the emitter of the second transistor and the anode of the second diode are coupled to the second terminal.

9. The component of claim 8, wherein the bases of the first and second transistors are coupled to a reference voltage.

10. The component of claim 9, wherein the common terminal is coupled to ground.

11. The component of claim 10, in combination with a circuit to be protected, wherein the first and second terminals are coupled to inputs of the circuit to be protected and the reference voltage is derived from the circuit to be protected.

12. The component of claim 8 further comprising:

a highly doped N-type layer;

an N-type substrate bordering the N-type layer, the substrate forming collectors of the first and second transistors;

first and second highly doped P-type regions formed in the substrate, wherein the P-type regions and the substrate form the first and second diodes, respectively;

a P-type well formed in the substrate, wherein the P-type well forms bases of the first and second transistors; and first and second highly doped N-type regions formed in the P-type well, wherein the first and second highly doped N-type regions form emitters of the first and second transistors, respectively.

13. The component of claim 12, further comprising a first metallization, coated on the highly doped N-type layer, coupled to ground.

14. The component of claim 13, further comprising a second metallization coated on the monolithic protection component, wherein the second metallization couples the first highly doped P-type region to the first highly doped N-type region.

15. The component of claim 14, further comprising a third metallization coated on the monolithic protection circuit, wherein the third metallization couples the second highly doped P-type region to the second highly doped N-type region.

16. The component of claim 15, further comprising a highly doped P-type region formed in the P-type well.

17. The component of claim 16, further comprising a fourth metallization coated on the highly doped P-type region formed in the P-type well, the fourth metallization being coupled to a reference voltage.

18. The component of claim 12, wherein the substrate is epitaxially grown on the highly doped N-type layer.

19. A monolithic semiconductor protection component comprising:

a first diode having a cathode and an anode;

a second diode having a cathode and an anode;

a common terminal, wherein the cathodes of the first and second diodes are coupled to the common terminal;

a first terminal, wherein the anode of the first diode is coupled to the first terminal;

a second terminal, wherein the anode of the second diode is coupled to the second terminal; and means for providing a low resistive connection between ground and the common terminal when the voltage at one of the first and second terminals is a voltage less than a reference voltage.

20. The component of claim 19, wherein the means for providing comprises a first and second transistor each having a base, emitter and collector, wherein the bases of the first and second transistors are coupled to the reference voltage, the collectors are coupled to the common terminal, the emitter of the first transistor is coupled to the first terminal and the emitter of the second transistor is coupled to the second terminal.

21. The component of claim 19, in combination with a circuit to be protected, wherein the circuit to be protected comprises a battery and the reference voltage is provided by the battery.

22. A method of protecting a circuit, having at least one input, from over and undervoltages occurring at the at least one input, the method comprising the steps of:

(A) receiving a reference voltage from the circuit;

(B) receiving an input signal at the at least one input;

(C) providing a first low resistive connection between the at least one input and ground when an overvoltage occurs at the input signal at the at least one input; and (D) providing a second low resistive connection between the at least one input and ground when an undervoltage below the reference voltage occurs at the at least one input.

23. The method of claim 22, wherein the at least one input comprises first and second inputs, and the method further comprises the steps of:

receiving a second input signal at the second input;

providing a third low resistive connection between the second input and ground when an overvoltage occurs at the second input signal at the second input; and providing a fourth low resistive connection between the second input and ground when an undervoltage below the reference voltage occurs at the second input.

24. The method of claim 22, wherein step (D) includes triggering a transistor into conduction to provide the low resistive connection.

* * * * *